United States Patent [19]

Shinozaki et al.

[11] Patent Number: 4,987,050
[45] Date of Patent: Jan. 22, 1991

[54] LIGHT-SENSITIVE TRANSFER MATERIAL AND IMAGE-FORMING PROCESS USING THE SAME

[75] Inventors: Fumiaki Shinozaki; Shunzo Yagami, both of Shizuoka, Japan

[73] Assignee: Fuji Photo Film Co., Ltd., Kanagawa, Japan

[21] Appl. No.: 446,362

[22] Filed: Dec. 5, 1989

[30] Foreign Application Priority Data

Dec. 6, 1988 [JP] Japan .................... 63-308629

[51] Int. Cl.$^5$ .............................. G03C 3/00
[52] U.S. Cl. ........................ 430/252; 430/5; 430/155; 430/156; 430/157; 430/227; 430/248; 430/271; 430/260; 430/269
[58] Field of Search ............ 430/5, 227, 248, 252, 430/271, 155, 156, 162, 260, 269, 293

[56] References Cited

U.S. PATENT DOCUMENTS

| | | | |
|---|---|---|---|
| 3,313,626 | 4/1967 | Whitney | 430/156 |
| 3,971,660 | 7/1976 | Staehle | 430/271 |
| 4,310,615 | 1/1982 | Steelman et al. | 430/271 |
| 4,666,818 | 5/1987 | Lake et al. | 430/319 |
| 4,803,145 | 2/1989 | Suzoki et al. | 430/271 |

*Primary Examiner*—Jack P. Brammer
*Attorney, Agent, or Firm*—Sughrue, Mion, Zinn, Macpeak & Seas

[57] ABSTRACT

A light-sensitive transfer material is disclosed, comprising a substantially transparent support having provided on one side thereof, in order from the support, a stripping layer, and a lamination of a colorant layer containing a dye or a pigment and a photoresist layer or a photoresist layer containing a dye or a pigment, and having provided on the other side thereof a physical development nuclei-containing layer adapted for diffusion transfer processing using a silver halide emulsion.

An image-forming process is also disclosed, comprising the steps of:
(a) developing the superposed physical development nuclei-containing layer of the light-sensitive transfer material described above and an imagewise exposed silver halide emulsion layer of a diffusion transfer process silver halide light-sensitive material, to thereby form a silver image;
(b) uniformly exposing the superposed materials from the silver image side thereof, to thereby expose the photoresist layer in conformance with the silver image;
(c) developing the exposed photoresist layer to form a colorant image on the support; and
(d) transferring the colorant image to an image-receiving sheet.

3 Claims, No Drawings

LIGHT-SENSITIVE TRANSFER MATERIAL AND IMAGE-FORMING PROCESS USING THE SAME

FIELD OF THE INVENTION

This invention relates to a light-sensitive transfer material for use in the printing field for preparing color proofs, and more particularly, to a light-sensitive transfer material which effectively employs existing scanners or contact type proof-preparing apparatus, and which is particularly useful for preparing a direct digital color proof having a good matching for printing matter and capable of being used in place of an existing surprint type color proof, and an image-forming process using the light-sensitive transfer material.

BACKGROUND OF THE INVENTION

Various surprint type proofs using photopolymers have conventionally been known and are described, for example, in JP-B-49-441 (the term "JP-B" as used herein means an "examined Japanese patent publication"), JP-B-46-15326 (corresponding to U.S. Pat. No. 3,721,557), JP-A-47-41830 (the term "JP-A" as used herein means a "published unexamined Japanese patent application"), JP-A-59-97140 (corresponding to U.S. Pat. No. 4,482,625), JP-A-61-188537, JP-A-61-213843, JP-A62-67529, JP-A-62-227140 (corresponding to U.S. Pat. No. 4,803,154), JP-A-63-2040, JP-A-63-2037, JP-A-63-2038, JP-A-63-2039, JP-A-63-74052, JP-A-61-189535 (corresponding to U.S. Pat. No. 4,766,053), JP-A-61-200535, JP-A-62-247384, JP-A-62-291634, JP-A-62-27735, JP-A-62-24737, JP-A-63-253941, JP-A-63-281351, JP-A-63-298337, JP-A-63-78788, JP-A-63-213838, U.S. patent application Ser. No. 199,822, M. H. Bruno, *Principles of Color Proofing*, ed. by Gama Communication (1968), James, *The Theory of the Photographic Process*, ed. by Macmillan Publishing Co., Inc. (1977), etc. A process of forming a color image which comprises imagewise exposing and developing a light-sensitive material comprising a substantially transparent support having provided thereon, in order, a stripping layer, a colorant layer containing a dye or a pigment and a photoresist layer or a photoresist layer containing a dye or a pigment to form a color image pattern, transferring the color image together with the stripping layer to an image-receiving layer by applying heat and pressure and, if necessary, retransferring the color image to a final support by applying heat and pressure, is greatly advantageous. Particularly, the above-described process provides a good matching for printing matter, accelerates the processing, and allows for common use in both negative-working type and positive-working type systems.

However, recent advances in electronics and communication techniques allow for the preparation of direct digital color proofs, and various systems have been developed to form these color proofs, including an ink jet system, a sublimation transfer system, a color paper system using a light-sensitive silver halide emulsion, an electrophotographic system, etc.

However, the ink jet system and the sublimation transfer system are disadvantageous in that the matching for printing matter is very poor with respect to image quality. The color paper system is disadvantageous in that, in comparison with the conventional surprint system using a photopolymer, the matching for printing matter is inferior, and liquid control for attaining stable processing is complicated. The electrophotographic system using a liquid toner is disadvantageous in that, although providing a good matching for printing matter as compared to the conventional photopolymer system, the evaporation of combustible organic solvents arises in the printing field where a large-sized color proof is required, such that the apparatus for an electrophotographic system is expensive, and a large investment in equipment is required.

SUMMARY OF THE INVENTION

The present invention solves the above-described problems.

Thus, a first object of the present invention is to provide a light-sensitive transfer material allowing existing equipment to be used effectively, thus minimizing investment in equipment and which is particularly useful for preparing a direct digital color proof having a good matching for printing matter and capable of being used in place of the existing surprint type color proof using a photopolymer, and to provide an image-forming process using the same.

A second object of the present invention is to provide a light-sensitive material which, after transfer of the colorant, can be employed as a presensitized plate or a lith film in a manner similar to conventional silver salt light-sensitive materials.

The above-described and other objects of the present invention are attained by a light-sensitive transfer material comprising a substantially transparent support having provided on one side thereof, in order from the support, a stripping layer, and a lamination of a colorant layer containing a dye or a pigment and a photoresist composition layer or a photoresist composition layer containing a dye or a pigment, and having provided on the other side thereof a physical development nuclei-containing layer adapted for diffusion transfer processing using a silver halide emulsion, and an image-forming process using the same.

DETAILED DESCRIPTION OF THE INVENTION

The light-sensitive transfer material of the present invention and the image-forming process of the present invention using the same are described in detail below.

A light-sensitive material having an ordinary silver halide emulsion layer is imagewise exposed to expose the silver halide emulsion layer. Then, the emulsion layer of the light-sensitive material and the physical development nuclei-containing layer of the light-sensitive transfer layer of the present invention are superposed and developed in a conventional manner to form a silver image on the physical development nuclei-containing layer of the light-sensitive transfer material of the present invention. Thereafter, the superposed materials are uniformly exposed from the side having the silver image to imagewise expose the photoresist layer, through the silver image serving as a mask, and the transparent support. The imagewise exposed photoresist layer is then developed to form a colorant image on the support of the light-sensitive transfer material of the present invention. This colorant image is then transferred to an image-receiving sheet on application of heat and pressure. Repetition of the above-described process for each color results in the formation of a multicolor halftone dot image on the image-receiving sheet. If necessary, a color proof having excellent matching for printing matter is obtained by superposing the image-receiving sheet having the color image formed thereon onto a final support, and applying heat and pressure to the assembly to thereby transfer the color image to the final support. Where the color image thus formed on the final support is checked to be normal, the sheet of the light-sensitive transfer sheet having the silver image formed on the substantially transparent support is useful as a lith film or as a presensitized plate. As the substantially transparent support for use in the present invention, the various supports described in the above-described patent publications (e.g., U.S. Pat. No. 4,482,625) may be used but, in order to resist the heat and pressure applied upon transfer, those having good dimensional stability are preferable. Thus, a polyethylene terephthalate film or a polycarbonate film of 25 to 200 μm in thickness is preferably used.

As the stripping layer for use in the present invention, the various stripping layers described in the above-noted patent publications (e.g., U.S. Pat. No. 4,482,625) may be used. In addition, an intermediate layer as disclosed, for example, in JP-A-63-2039 or U.S. Pat. No. 4,482,625 may be provided on the stripping layer. Thickness values of these layers are selected depending on the optical dot gain quantity and, in order to make the gain quantities of the respective colors of the finished colorant images as uniform as possible, the sum of the thickness of the stripping layer and that of the intermediate layer is preferably from 0.2 μm to 5 μm.

As to the lamination of a colorant layer containing a dye or a pigment and a photoresist layer or the photoresist layer containing a dye or a pigment, the various systems described in the above-noted patent publications (e.g., U.S. Pat. No. 4,482,625) may be used. When using a photopolymerizable light-sensitive layer or diazonium salt-containing light-sensitive layer capable of being developed with an alkaline aqueous solution as a photoresist layer, it is preferable to cover the photoresist layer by a delaminatable film of about 4 μm to about 200 μm in thickness such as a polyethylene film, a polypropylene film, a polyethylene terephthalate film, a polyvinylidene film, a polyvinyl chloride film, a cellulose acetate film, a polyvinyl alcohol film, a polybutyral film, etc., for protecting the photoresist layer upon the development of the silver image using a diffusion transfer process.

In the light-sensitive transfer material of the present invention, techniques for providing the physical development nuclei for diffusion transfer on the side of the support opposite to the photoresist layer are known and are described in, for example, U.S. Pat. No. 2,774,667, JP-A-63-218955, JP-A-63-249845, JP-A-63-253358, etc.

As the developer for the photoresist layer of the present invention, those developers described in the above-noted patent publications (e.g., U.S. Pat. No. 4,482,625) may be used, but in view of environmental factors, an alkaline aqueous solution developer is particularly preferred.

As the image-receiving sheet of the present invention, those described in the above-noted publications (e.g., U.S. Pat. No. 4,482,625) may be used.

The present invention is illustrated below in greater detail with reference to the following examples which, however, are not to be construed as limiting the present invention in any way.

EXAMPLE 1

One side of a 100 μm thick polyethylene terephthalate film was subjected to glow discharge treatment and an image-receiving layer for diffusion transfer composed of metallic palladium nuclei-containing gelatin ($10^{-7}$ g/cm$^2$) and carboxymethyl cellulose (4:1 by weight) was then provided thereon in a dry weight of gelatin of 3 g/m$^2$.

Then, a solution of the following composition was prepared as a coating solution for forming a stripping layer, as provided below.

| | |
|---|---|
| Alcohol-Soluble Polyamide (CM-8000, made by Toray Co., Ltd.; [η] = 23 cps: 20° C., 10 wt % methanol soln.) | 7.2 g |
| Polyhydroxystyrene (Resin M; made by Maruzen Co., Ltd.; molecular weight: 5,500) | 1.8 g |
| Methanol | 400 g |
| Methyl Cellosolve | 100 g |

This coating solution was uniformly coated on the side of the polyethylene terephthalate film opposite to the side on which the diffusion transfer physical development nuclei-containing layer had been provided, and dried to form a stripping layer of 0.5 μm of dry film thickness.

Then, in order to conduct negative-to-positive type image formation, light-sensitive solutions of four colors of yellow (Y), magenta (M), cyan (C) and black (B), respectively, were prepared according to the formulation shown in the following Table 1.

On the four supports having provided thereon the stripping layer, one of each of the following light-sensitive solutions of the four colors were coated and then dried to provide a 2.4 μm thick light-sensitive resin layer of one color on each support.

TABLE 1

| | Y (g) | M (g) | C (g) | B (g) |
|---|---|---|---|---|
| Benzyl Methacrylate/Methacrylic Acid Copolymer (molar ratio: 73/27; viscosity [η]: 0.12) | 60 | 60 | 60 | 60 |
| Pentaerythritol Tetraacrylate | 43.2 | 43.2 | 43.2 | 43.2 |
| Michler's Ketone | 2.4 | 2.4 | 2.4 | 2.4 |
| 2-(o-Chlorophenyl)-4,5-diphenyl-imidazole Dimer | 2.5 | 2.5 | 2.5 | 2.5 |
| Seika Fast Yellow II-0755 (made by Dainichi Seika Kogyo Mfg. Co., Ltd.) | 9.4 | — | — | — |
| Seika Fast Carmine 1483 (made by Dainichi Seika Kogyo Mfg. Co., Ltd.) | — | 5.2 | — | — |
| Cyanine Blue 4820 (made by Dainichi Seika Kogyo Mfg. Co., Ltd.) | — | — | 5.6 | — |
| Mitsubishi Carbon Black KA-100 (Mitsubishi Chemical Industries Ltd.) | — | — | — | 6.6 |
| Methyl Cellosolve Acetate | 560 | 560 | 560 | 560 |
| Methyl Ethyl Ketone | 280 | 280 | 280 | 280 |

Note:
Viscosity [η] means a limiting viscosity at 25° C. in a methyl ethyl ketone solution.

Then, a 25 μm thick triacetate film (Fuji Tack made by Fuji Photo Film Co., Ltd.) was laminated on each of the support having provided thereon the light-sensitive resin layer containing said color to prepare four light-sensitive transfer materials of four different colors, respectively.

Then, a diffusion transfer process silver halide light-sensitive material, QNL-150 made by Fuji Photo Film Co., Ltd. used as the silver halide light-sensitive material, was imagewise exposed by a yellow component obtained by scanner separation. The exposed material and the physical development nuclei-containing layer of the aforesaid light-sensitive transfer material having the yellow colorant were then superposed upon each other and developed by means of a Fuji Q-ART system processor (made by Fuji Photo Film Co., Ltd.; developer: QA-1) to form a silver image on the physical development nuclei-containing layer of said light-sensitive transfer material. Thereafter, the laminate was uniformly exposed from the silver image side thereof for 15 seconds using ultraviolet rays by means of a P-607FW bright room printer (made by Dainippon Screen Mfg. Co., Ltd.). The triacetate film was delaminated, and the resin layer was developed using a developer (Fuji Color Art Processing Agent CA-1) in a Fuji Color Art Processor CA-600 (made by Fuji Photo Film Co., Ltd.) to prepare a yellow image reverse to the silver image. Magenta, cyan and black images were prepared in the same manner. Thereafter, each of the color images was transferred onto an image-receiving sheet, Fuji Color Art CR-T3 (made by Fuji Photo Film Co., Ltd.) using a transferring machine, Fuji Color Art CA600TII (made by Fuji Photo Film Co., Ltd.), and each color image on the image-receiving sheet was retransferred to an art paper (45 g/A3 size) to prepare a color image on the art paper. Each of the silver image-carrying light-sensitive transfer materials from which the color image had been transferred was useful as a mask for lith films or presensitized plates.

EXAMPLE 2

The side of a polyethylene terephthalate film opposite to that having a diffusion transfer process physical development nuclei-containing layer and prepared as in Example 1, was uniformly coated with a solution of the following composition in a dry thickness of 0.5 μm, to provide a stripping layer.

| | |
|---|---|
| Alcohol-Soluble Polyamide | 7.2 g |
| (CM-8000, made by Toray Co., Ltd.; | |
| [η] = 23 cps: 20° C., 10 wt % methanol soln.) | |
| Polyhydroxystyrene (Resin M; made by | 1.8 g |
| Maruzen Co., Ltd.; molecular weight: | |
| 5,500) | |
| Methanol | 400 g |
| Methyl Cellosolve | 100 g |

Then, a solution of the following composition was prepared as a coating solution for forming an interlayer.

| | |
|---|---|
| Polymethyl Methacrylate | 3 g |
| (average molecular weight: 100,000) | |
| Methyl Ethyl Ketone | 80 g |
| Methyl Cellosolve Acetate | 20 g |

This coating solution was uniformly coated over the above-described stripping layer and dried to provide an interlayer of 0.5 μm dry thickness.

Then, mother solution I and mother solution II of the following compositions used for dispersing a pigment, were prepared for forming colorant layers.

| | |
|---|---|
| Mother Solution I: | |
| Styrene/Maleic Acid Copolymer Resin | 20 g |
| (Oxyrack SH-101; made by Japan Catalytic | |
| Chemical Industry Co., Ltd.) | |
| n-Propanol | 80 g |
| Mother Solution II: | |
| Methoxymethylated Nylon (Toresin MF-30; | 10 g |
| made by Teikoku Chemical Co., Ltd.) | |
| Methanol | 90 g |

The, four pigment dispersions of different colors and having the following compositions were prepared using mother solutions I and II.

| | |
|---|---|
| Coating Solution for Forming Yellow Colorant Layer: | |
| Mother Solution I | 95 g |
| Mother Solution II | 30 g |
| n-Propanol | 28 g |
| Acetone | 20 g |
| Seika Fast Yellow H-0755 (made by) | 12.2 g |
| Dainichi Seika Kogyo Mfg. Co., Ltd.) | |
| Coating Solution for Forming Magenta Colorant Layer: | |
| Mother Solution I | 95 g |
| Mother Solution II | 30 g |
| n-Propanol | 28 g |
| Acetone | 20 g |
| Seika Fast Carmine 1483 (made by | 12.2 g |
| Dainichi Seika Kogyo Mfg. Co., Ltd.) | |
| Coating Solution for Forming Cyan Colorant Layer: | |
| Mother Solution I | 95 g |
| Mother Solution II | 30 g |
| n-Propanol | 28 g |
| Acetone | 20 g |
| Cyanine Blue 4920 (made by | 12.2 g |
| Dainichi Seika Kogyo Mfg. Co., Ltd.) | |
| Coating Solution for Forming Black Colorant Layer: | |
| Mother Solution I | 95 g |
| Mother Solution II | 30 g |
| n-Propanol | 28 g |
| Acetone | 20 g |
| Mitsubishi Carbon Black MA-100 (made by | 12.2 g |
| Mitsubishi Chemical Industries, Ltd.) | |

The dispersions were prepared in a dispersing machine (paint shaker; made by Toyo Seiki Co., Ltd.) over a 6 hour period.

Then, A diluent of the following composition for the pigment dispersions was prepared.

| | |
|---|---|
| Methyl Ethyl Ketone | 40 g |
| Acetone | 28 g |
| Fluorine-Containing Surfactant | 0.2 g |
| (Florad FC430; made by Sumitomo 3M | |
| Co., Ltd.) | |

The four color pigment dispersions were diluted with the above-described diluent according to the following weight ratios, and then stirred for 10 minutes and subjected to ultrasonic dispersion for 10 minutes to prepare colorant layer coating solutions.

These colorant layer coating solutions were filtered through Toyo filtration paper No. 63 filter, then coated, respectively, on four tentative supports using a whirler (i.e., spin coater or spinning apparatus), followed by drying at 100° C. for 2 minutes to form colorant layers for the respective four colors.

| Colorant Layer | Pigment Dispersions/ Diluent (by weight) | Thickness (μm) | Filter | Optical Density |
|---|---|---|---|---|
| Yellow | 3.5/46.5 | 2.1 | Blue | 0.50 |
| Magenta | 4/46 | 0.65 | Green | 0.75 |
| Cyan | 4/46 | 0.75 | Red | 0.65 |
| Black | 5.5/44.5 | 0.7 | None | 0.90 |

Furthermore, on each of the four color colorant layers was coated a light-sensitive solution of the following composition having been filtered through the above-described No. 63 filter, using a whirler, and then dried at 100° C. for 2 minutes to form a light-sensitive layer (dry thickness: 1.0 μm).

| | |
|---|---|
| Adduct of the Condensation Product of Acetone and Pyrogallol (average polymerization degree: 3) and 2-Diazo-1-naphthol-4-sulfonyl Chloride | 15 g |
| Novolak Type Phenol-Formaldehyde Resin (PR-50716; made by Sumitomo Duress Co., Ltd.) | 30 g |
| Tricresyl Phosphate | 5 g |
| n-Propyl Acetate | 280 g |
| Cyclohexanone | 120 g |

Thus, four colored light-sensitive sheets each comprising a support having provided thereon, in order, an alcohol-soluble polyamide-containing stripping layer, an alcohol-insoluble interlayer, a colorant layer and a light-sensitive layer were prepared.

Then, a silver image was formed on the physical development nuclei-containing layer of the light-sensitive transfer material in the same manner as in Example 1, using an imagewise exposed diffusion transfer process silver halide light-sensitive material to form a laminate. The laminate was then uniformly exposed from the silver image side, followed by development in the following solution, to thereby form a color image corresponding to the silver image.

| Composition of Developer: | |
|---|---|
| JIS No. 1 Sodium Silicate | 100 g |
| Sodium Metasilicate | 50 g |
| Pure Water | 1,800 ml |

Separately, a coating solution of the following composition was coated in a dry thickness of 20 μm on a 100 μm thick biaxially stretched polyethylene terephthalate film to prepare an image-receiving sheet.

| | |
|---|---|
| Methyl Methacrylate Polymer (average molecular weight: 100,000; made by Wako Pure Chemical Industries, Ltd.) | 90 g |
| Pentaerythritol Tetraacrylate | 90 g |
| Michler's Ketone | 0.51 g |

| -continued | |
|---|---|
| Benzophenone | 3.18 g |
| p-Methoxyphenol | 0.09 g |
| Methyl Ethyl Ketone | 220 g |

Then, the black color proofing sheet was superposed on the image-receiving sheet in such a manner that the image side came into contact with the coated side of the image-receiving sheet. Lamination was conducted by means of a color art transfer machine, CA-600T (made by Fuji Photo Film Co., Ltd.), followed by delaminating the support of the color proofing sheet to transfer the black image onto the image-receiving sheet. Subsequently, this transferring procedure was repeated for the remaining three color proofing sheets to obtain an image-receiving sheet having transferred thereon four color halftone dot images.

Then, the image-receiving sheet having transferred thereon the four color images and an art paper (final support) were superposed, and laminated using the above-described transfer machine. The laminate was then uniformly exposed from the image-receiving sheet side for 120 seconds using a P-607FW bright room printer (using a 1 kw high pressure mercury lamp; made by Dainippon Screen Mfg. Co., Ltd.). The support of the image-receiving sheet was then removed to obtain a final image (color proof) having an excellent matching for printing matter.

While the invention has been described in detail and with reference to specific embodiments thereof, it will be apparent to one skilled in the art that various changes and modifications can be made therein without departing from the spirit and scope thereof.

What is claimed is:

1. A light-sensitive transfer material comprising a substantially transparent support having provided on one side thereof, in order from the support, a stripping layer, and a lamination of a colorant layer containing a dye or a pigment and a photoresist layer or a photoresist layer containing a dye or a pigment, and having provided on the other side thereof a physical development nuclei-containing layer adapted for diffusion transfer processing using a silver halide emulsion.

2. A light-sensitive transfer material as in claim 1, further comprising an intermediate layer provided on the stripping layer.

3. A light-sensitive transfer material as in claim 2, wherein the sum of the thickness of the stripping layer and the intermediate layer is from 0.2 μm to 5 μm.

* * * * *